United States Patent
Van Den Brink et al.

(10) Patent No.: US 6,377,045 B1
(45) Date of Patent: Apr. 23, 2002

(54) MAGNETIC RESONANCE IMAGING METHOD WITH SUB-SAMPLING

(75) Inventors: Johan Samuel Van Den Brink; Rudolf Mathias Johannes Nicolaas Lamerichs; Paulus Johannes Maria Folkers; Arianne Margarethe Corinne Van Muiswinkel, all of Eindhoven (NL); Klaas Paul Pruessmann, Zurich (CH); Markus Weiger, Dietikon (CH); Ulrike Dydak, Zurich (CH)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/572,994

(22) Filed: May 17, 2000

(30) Foreign Application Priority Data

May 20, 1999 (EP) .............................. 99201642

(51) Int. Cl.[7] .............................................. G01V 3/00
(52) U.S. Cl. ..................................... 324/307; 324/309
(58) Field of Search ................................ 324/309, 307, 324/306, 300, 314, 312, 318, 322; 600/410, 421, 422

(56) References Cited

U.S. PATENT DOCUMENTS 5,910,728 A * 6/1999 Sodickson .................. 324/309
6,104,943 A * 8/2000 Frederick et al. ........... 600/410

FOREIGN PATENT DOCUMENTS

| EP | 0335534 A3 | 10/1989 | .......... G01N/24/08 |
| EP | 0335534 A2 | 10/1989 | .......... G01N/24/08 |
| WO | WO9954746 | 10/1999 | ....... G01R/33/3415 |

OTHER PUBLICATIONS

Sodickson D K Et Al: "Signal-to-noise ratio and signal-to-noise efficiency in Smash imaging" Magnetic Resonance in Medicine, May 1999, Wiley, USA, vol. 41, No. 5, pp. 1009–1022.

K. P. Pruessmann Et Al: "Coil Sensitivity Encoding for Fast MRI" Proceedings of the International Society for Magnetic Resonance in Medicine, Sixth Scientific Meeting and Exhibition, Sydney, Australia, Apr. 18–24, 1998, vol. 1, p. 579.

Wald L L Et Al: "Proton Spectroscopic Imaging of the Human Brain Using Phased Array Detectors" Magnetic Resonance in Medicine, US, Academic Press, Duluth, MN, vol. 34, No. 3, Sep. 1, 1995, pp. 440–445.

P. Wielopolski Et Al: "Pulmonary Embolism Detection using Contrast–Enhanced, Breathhold 3D Magnetic Resonance Angiography: Preliminary Experience" Proceedings of the International Society for Magnetic Resonance in Medicine, Fourth Scientific Meeting and Exhibition New York, USA, Apr. 27–May 3, 1996, vol. 2, p. 705.

"Coil Sensitivity Encoding for Fast MRI" by Klaas P. Pruessmann, Markus Weiger, Markus B. Scheidegger, and Peter Boesiger, in Proceedings ISMRM (1998), p. 579.

* cited by examiner

*Primary Examiner*—Louis Arana
(74) *Attorney, Agent, or Firm*—John Vodopia

(57) ABSTRACT

A spectroscopic magnetic resonance imaging method involves sub-sampling in the k space. For example, the SENSE technique is applied in spectroscopic MR imaging. Such sub-sampling is also applied in three-dimensional MR imaging.

10 Claims, 1 Drawing Sheet

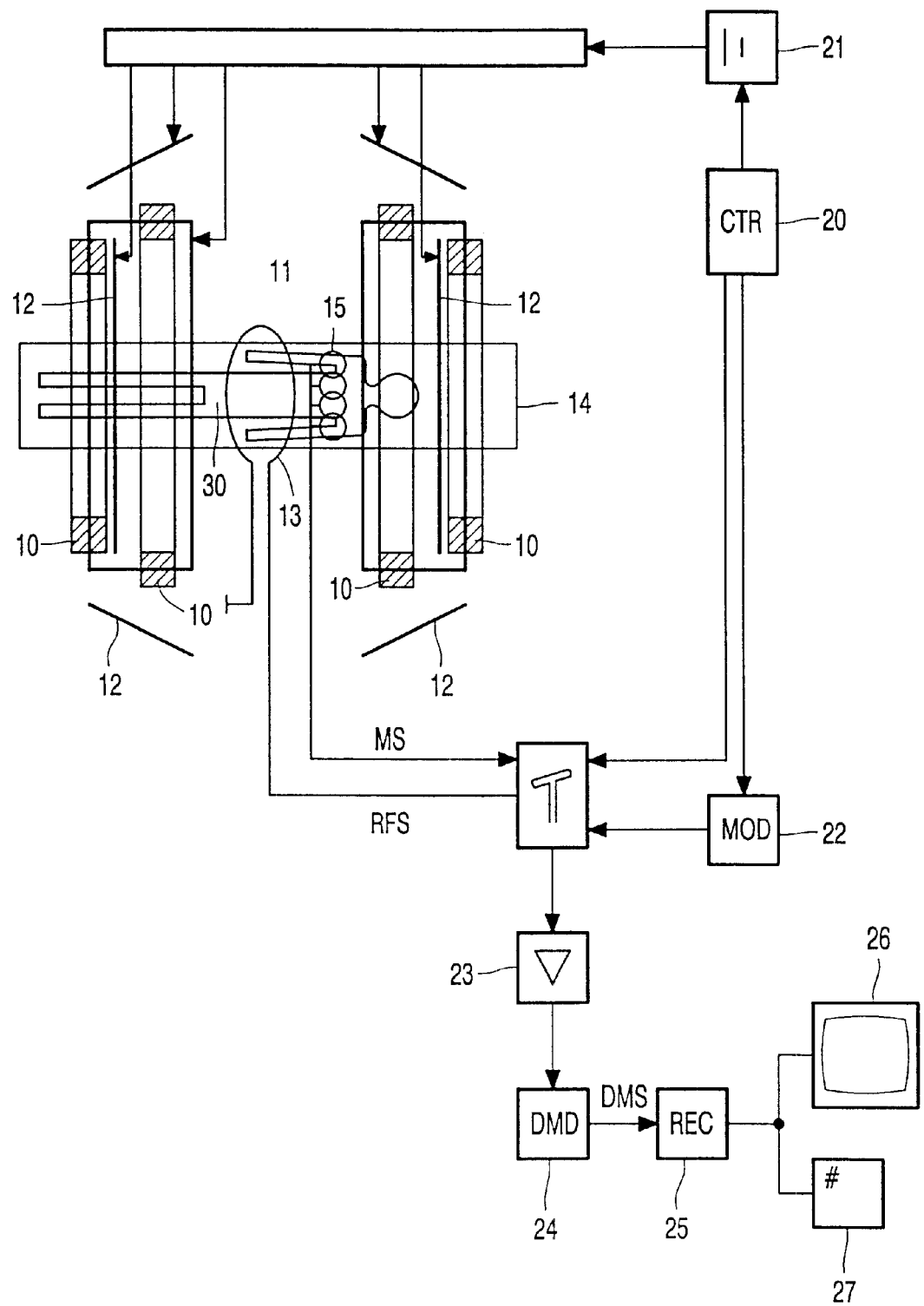

MAGNETIC RESONANCE IMAGING METHOD WITH SUB-SAMPLING

BACKGROUND OF THE INVENTION

The invention relates to a magnetic resonance imaging method utilizing a coil sensitivity profile.

The article "Coil Sensitivity Encoding for Fast MRI" by K. P. Pruesmann et al. in Proceedings ISMRM (1998), page 579, deals with a magnetic resonance imaging method involving sub-sampled acquisition of magnetic resonance signals.

The known magnetic resonance imaging method is used in the so-called SENSE technique. In order to form a magnetic resonance image of an object, for example a patient to be examined, the object is arranged in a steady, preferably as spatially uniform as possible magnetic field. Nuclear spins are excited in the object by one or more RF excitation pulses, thus generating a magnetic nuclear spin polarization. Due to precession and relaxation of the nuclear spin polarization, magnetic resonance signals are emitted. The magnetic resonance signals are received by the receiving coils with sub-sampled scanning of the k space for a given spatial resolution of the magnetic resonance image. Respective receiving coil images are reconstructed from the sub-sampled magnetic resonance signals acquired by the individual receiving coils. Due to the sub-sampling, such receiving coil images usually contain artefacts such as so-called aliasing effects. A final magnetic resonance image in which the artefacts due to sub-sampling, as they occur in the receiving coil images, have been significantly reduced or even completely eliminated is derived from the receiving coil images and on the basis of the spatial sensitivity profiles of the receiving coils.

The known magnetic resonance imaging method enables the formation of a magnetic resonance image which reproduces the local density of hydrogen nuclei (protons) in the body of the patient to be examined.

SUMMARY OF THE INVENTION

It is an object of the invention to provide a magnetic resonance imaging method wherein spectroscopic information of the object to be examined, for example a patient to be examined, is reproduced in an image and wherein the magnetic resonance signals are acquired within a short period of time.

This object is achieved by means of a magnetic resonance imaging method according to the invention wherein an RF excitation pulse is generated in an examination space, magnetic resonance signals are generated, due to the RF excitation pulse, in an object to be examined in the examination space, the magnetic resonance signals being received in a sub-sampled fashion by a set of receiving coils having a coil sensitivity profile, wherein the positions in a measuring plane in the examination space in which the magnetic resonance signals are generated are encoded on the basis of at least two linearly independent components of the wave vector of the magnetic resonance signals, and the frequency distribution of the magnetic resonance signals represents spectroscopic information concerning the object to be examined, and a spectroscopic magnetic resonance image is reconstructed from the sub-sampled magnetic resonance signals and the coil sensitivity profile.

A steady, as uniform as possible magnetic field is applied to the examination space in order to form the spectroscopic magnetic resonance image. As a result, the spins are oriented in the direction of the steady magnetic field in the object to be examined in the examination space. The object to be examined is, for example a patient to be examined who is arranged completely or partly in the examination space. The magnetic resonance signals are encoded on the basis of two linearly independent, for example mutually perpendicular, components of the wave vector. Such encoding in a two-dimensional plane in the k space is realized by superposing temporary gradient fields on the steady magnetic field. The magnetic resonance signals constitute a two-dimensional spatial Fourier transform of spatially varying spectral densities of the object to be examined. The spectral information is then represented by the temporal frequency components of the individual spatial frequency components of the magnetic resonance signals. Via inverse spatial Fourier transformation a set of spectra in separate positions in the object to be examined is derived from the magnetic resonance signals encoded in a plane in the k space. The set of spectra, i.e. local spectroscopic profiles form the spectroscopic magnetic resonance image. The local chemical composition of the object can be studied on the basis of such a set of spectra.

According to the invention the magnetic resonance signals are acquired by the receiving coils with sub-sampling of the scanning of the k space with a given spatial resolution of the spectral magnetic resonance image. As a result, the time required to receive the required number of magnetic resonance signals is substantially reduced. As the degree of such sub-sampling is higher, a smaller part of the k space will be scanned and less time will be required to acquire the magnetic resonance signals. The spectroscopic magnetic resonance image can be derived from the sub-sampled magnetic resonance signals in various manners without giving rise to serious disturbances due to the sub-sampling.

The time required for acquisition of the magnetic resonance (MR) signals is reduced by employing sub-sampling of the MR-signals. Such sub-sampling involves a reduction in k-space of the number of sampled points which can be achieved in various ways. Notably, the MR signals are picked-up through signal channels pertaining to several receiver antennae, such as receiver coils, preferably surface coils. Acquisition through several; signal channels enables parallel acquisition of signals so as to further reduce the signal acquisition time.

Owing to the sub-sampling, sampled data contain contributions from several positions in the object being imaged. The magnetic resonance image is reconstructed from the sub-sampled MR-signals with the use of a sensitivity profile associated with the signal channels. Notably, the sensitivity profile is for example the spatial sensitivity profile of the receiver antennae, such as receiver coils. Preferably, surface coils are employed as the receiver antennae. The reconstructed magnetic resonance image may be considered as being composed of a large number of spatial harmonic components which are associated with brightness/contrast variations at respective wavelengths. The resolution of the magnetic resonance image is determined by the smallest wavelength, that is by the highest wavenumber (k-value). The largest wavelength, i.e. the smallest wavenumber, involved, is the field-of-view (FOV) of the magnetic resonance image. The resolution is determined by the ratio of the field-of-view and the number of samples.

The sub sampling may be achieved in that respective receiver antennae acquire MR signals such that their resolution is coarser than required for the resolution of the magnetic resonance image. The smallest wavenumber sampled, i.e. the minimum step-size in k-space, is increased while the largest wavenumber sampled is maintained. Hence, the image resolution remains the same when applying sub-sampling, while the minimum k-space step increases, i.e. the FOV decreases. The sub-sampling may be achieved by reduction of the sample density in k-space, for instance by skipping lines in the scanning of k-space so that lines in k-space are scanned which are more widely separated than required for the resolution of the magnetic resonance image. The sub-sampling may be achieved by reducing the field-of-view while maintaining the largest k-value so that the number of sampled points is accordingly reduced. Owing to the reduced field-of-view sampled data contain contributions from several positions in the object being imaged.

Notably, when receiver coil images are reconstructed from sub-sampled MR-signals from respective receiver coils, such receiver coil images contain aliasing artefacts caused by the reduced field-of-view. From the receiver coil images and the sensitivity profiles the contributions in individual positions of the receiver coil images from different positions in the image are disentangled and the magnetic resonance image is reconstructed. This MR-imaging method is known as such under the acronym SENSE-method. This SENSE-method is discussed in more detail in the international application no. WO 99/54746-A1.

Alternatively, the sub-sampled MR-signals may be combined into combined MR-signals which provide sampling of k-space corresponding to the full field-of-view. In particular, according to the so-called SMASH-method sub-sampled MR-signals approximate low-order spherical harmonics which are combined according to the sensitivity profiles. The SMASH-method is known as such from the international application no. WO 98/21600.

Sub-sampling may also be carried-out spatially. In that case the spatial resolution of the MR-signals is less than the resolution of the magnetic resonance image and MR-signals corresponding to a full resolution of the magnetic resonance image are formed on the basis of the sensitivity profile. Spatial sub-sampling is in particular achieved in that MR-signals in separate signal channels, e.g. from individual receiver coils, form a combination of contributions from several portions of the object. Such portions are for example simultaneously excited slices. Often the MR-signals in each signal channel form linear combinations of contributions from several portions, e.g. slices. This linear combination involves the sensitivity profile associated with the signal channels, i.e. of the receiver coils. Thus, the MR-signals of the respective signal channels and the MR-signals of respective portions (slices) are related by a sensitivity matrix which represents weights of the contribution of several portions of the object in the respective signal channels due to the sensitivity profile. By inversion of the sensitivity matrix, MR-signals pertaining to respective portions of the object are derived. In particular MR-signals from respective slices are derived and magnetic resonance images of these slices are reconstructed.

For example, receiving coil images are reconstructed from the magnetic resonance signals from individual receiving coils.

For example, for a field of view of 110 mm a spectroscopic image with a 16×16 matrix can be reconstructed by means of a steady magnetic field having a strength of 1.5 T. In the case of an MR pulse sequence with a repetition time TR=1.5 s, an echo time TE=136 ms and a bandwidth of the magnetic resonance signals of 0.75 kHz, the local spectra can be sampled with 512 samples. A period of time of approximately 6.5 minutes is the required so as to acquire and reconstruct the spectroscopic magnetic resonance image. In the present example the set of receiving coils includes six surface coils. It has been found that the spectroscopic magnetic resonance image then has a suitable spectroscopic resolution. It has also been found that the peaks associated with the substances N-acetyl aspartate (NAA), creatine and choline can be suitably distinguished from one another in the spectra.

Because sub-sampling of the k space is applied for the acquisition of the magnetic resonance signals, the time during which the magnetic resonance signals, notably repeated echo signals, are acquired is so short that hardly any decay of the magnetic resonance signals occurs due to the dephasing due to transverse relaxation.

These and other aspects of the invention will be elaborated on the basis of the following embodiments which are defined in the dependent Claims.

The spatial encoding of the magnetic resonance signals representing local spectral information of the object in the examination space is preferably realized by the superposition of temporary phase encoding gradients on the steady magnetic field. Such phase encoding gradients are applied after the excitation by the RF excitation pulse and prior to the reception of the relevant magnetic resonance signals, for example MR echo signals. For example, two mutually perpendicular phase encoding gradients are applied. In that case additional steps, such as the known PRESS technique, are taken so as to receive magnetic resonance signals from (nuclear) spins in a plane transversely of the two phase encoding gradients. It is also possible to apply phase encoding gradients in three linearly independent directions. Preferably, phase encoding gradients are applied in three mutually perpendicular directions. The three-dimensional positions in the examination space in which the magnetic resonance signals are generated are thus encoded. The magnetic resonance signals represent local spectroscopic information for separate three-dimensional positions in the examination space. By applying sub-sampling in the k space in the three directions of the phase encoding gradients, the measuring time for generating and receiving the necessary magnetic resonance signals can be kept comparatively short; for example, the measuring time amounts to approximately 25 minutes. The artefacts in the spectroscopic magnetic resonance image are reduced on the basis of the coil sensitivity profile of the set of receiving coils.

The phase encoding per se, so without the sub-sampling, is carried out, for example in conformity with known phase encoding methods used in magnetic resonance imaging methods with complete sampling, for example Echo Planar Spectroscopic Images (EP-SI).

The spatial encoding is realized notably, and preferably exclusively, by phase encoding gradients. This notably enables spectroscopy to be performed on substances such as $^{13}C$ exhibiting a large dispersion in chemical spectral shift.

Preferably, spectroscopic receiving coil images are reconstructed from the magnetic resonance signals received in a sub-sampled fashion by the individual receiving coils. Such spectroscopic receiving coil images represent the local spectroscopic information of the object in the examination space. Due to the sub-sampling in the k space, artefacts occur in the spectroscopic receiving coil images, notably so-called aliasing effects. On the basis of the coil sensitivity profile, the (final) magnetic resonance image in which such artefacts have been substantially reduced is derived from such spectroscopic receiving coil images. The reconstruction from the (spectroscopic) receiving coil images per se is called the SENSE technique. The SENSE technique renders the spectroscopic magnetic resonance imaging method independent of the configuration of receiving coils. Preferably, surface coils are used as the receiving coils, the reconstruction of the spectroscopic magnetic resonance image from the receiving coil images is very well possible for a wide variety of spatial configurations of the receiving coils. This means that the configuration of receiving coils can be appropriately chosen for different MR examinations, for example of different parts of the body of the patient to be examined. The set of receiving coils is preferably configured so that the magnetic resonance signals of the organ to be spectroscopically examined are received as well as possible and with as few disturbances as possible.

It is a further object of the invention to provide a magnetic resonance imaging method whereby three-dimensional information of the object to be examined, for example a patient to be examined, is reproduced in an image and wherein the magnetic resonance signals are acquired within a short period of time.

This object is achieved by means of a magnetic resonance imaging method according to the invention in which an RF excitation pulse is generated in an examination space, magnetic resonance signals are generated, due to the RF excitation pulse, in an object to be examined in the examination space, the magnetic resonance signals are received in a sub-sampled fashion by a set of receiving coils having a spatial coil sensitivity profile, and wherein the positions in the examination space in which the magnetic resonance signals are generated are encoded in three dimensions on the basis of gradient fields in three linearly independent directions, and a three-dimensional density distribution of the object is reconstructed from the sub-sampled magnetic resonance signals and the coil sensitivity profile.

The reconstruction of the three-dimensional density distribution can be carried by means of the previously mentioned SENSE or SMASH techniques. Notably the SENSE technique enables the receiving coils, such as surface coils, to be arranged in such a way that the magnetic resonance signals are received as well as possible and without disturbances from the three-dimensional part of the patient to be examined.

For example, according to the invention a three-dimensional density distribution of the brain of the patient to be examined can be reconstructed. To this end, in the presence of a steady magnetic field of 1.5 T the magnetic resonance signals are generated as gradient echo signals in an EPI sequence. This EPI sequence utilizes a temporal echo shift which is known per se as the PRESTO technique. The gradient echo signals are received by means of a synergy coil and two surface coils which are arranged to both sides of the head of the patient to be examined. In the present example the three-dimensional density distribution is reconstructed while utilizing the SENSE technique with a sub-sampling which is represented by the SENSE reduction factor R, where R=2. The density distribution is represented by a three-dimensional 64×24×30 matrix in which the size of the volume elements or voxels is 3.5 mm$^3$. Because of the sub-sampling, the magnetic resonance signals can be acquired with a single RF excitation and the magnetic resonance signals are received within an acquisition time of approximately 1 s.

Preferably, the magnetic resonance signals are spatially encoded by applying two linearly independent, for example mutually perpendicular, phase encoding gradients prior to the reception of the magnetic resonance signals. Spatial encoding in a plane is thus achieved. By application of a read-out gradient in a direction which is not parallel but preferably perpendicular to the two phase encoding gradients during the reception of the magnetic resonance signals, encoding is performed in the direction perpendicular to the plane of the phase encoding. The signal levels of the magnetic resonance imaging system, now being three-dimensionally encoded, represent density values of, for example the hydrogen nuclei (protons) in the object to be examined.

The sub-sampling is preferably performed in relation to one or more of the phase encoding gradients. The sub-sampling implies that in one or more of the phase encoding directions in the k space fewer lines are scanned than required for the predetermined spatial resolution of the density distribution. Magnetic resonance signals which have the same phase encoding but nevertheless relate to different positions in the object to be examined are distinguished from one another on the basis of the coil sensitivity profile. Because of the distinction offered by the coil sensitivity profiles and the encoding on the basis of the phase encoding gradients and the read-out gradient, an accurate three-dimensional density distribution can be reconstructed from the magnetic resonance signals. Receiving coil densities are then reconstructed, for example from the sub-sampled magnetic resonance signals from individual receiving coils. Such receiving coil densities contain disturbances, such as aliasing, due to the sub-sampling. The three-dimensional density distribution can be reconstructed from the receiving coil densities and on the basis of the coil sensitivity profile of the receiving coils, the aliasing being strongly reduced or even completely eliminated therein.

The coil sensitivity profile is measured, for example prior to the acquisition of the sub-sampled magnetic resonance signals for a three-dimensional volume in the object to be examined. If desired, separate sub-profiles can be derived from such a three-dimensional coil sensitivity profile. Such sub-profiles represent the spatial sensitivity of the set of receiving coils in individual parts of the measured three-dimensional coil sensitivity profile. The sub-profiles are derived preferably by means of a Multi-Planar Reformatting (MPR) technique. The individual sub-profiles from the measured coil sensitivity profile are used for the reconstruction of the spectroscopic image or a three-dimensional density distribution of respective parts of the object to be examined. It is thus avoided that the coil sensitivity profile has to be measured time and again for the reconstruction of the spectroscopic image or the three-dimensional density distribution of individual parts of the object to be examined.

For example, the reconstruction of the three-dimensional density distribution is used in combination with the administration of a contrast agent to the patient to be examined. The three-dimensional density distribution is then reconstructed notably of the part of the patient to be examined in which the contrast agent is present. When sub-sampling is applied, only a short acquisition time will be required for the acquisition of the magnetic resonance signals. Consequently, a three-dimensional density distribution which relates to a part of the arteries of the vascular system of the patient to be examined can thus be derived from the magnetic resonance signals and on the basis of the coil sensitivity profile. Because the acquisition time is short, the magnetic resonance signals can be acquired before the contrast agent reaches the veins via which it is discharged. According to the invention it is thus possible to reconstruct a three-dimensional density distribution of the part with the arteries in which there are hardly any or no disturbances due to magnetic resonance signals originating from the veins of the patient to be examined. This application of the invention is particularly suitable for forming a three-dimensional density distribution of the carotids and intracranial vessels.

The invention also relates to a magnetic resonance imaging system. It is an object of the invention to provide a magnetic resonance imaging system for carrying out the magnetic resonance imaging methods according to the invention. Such a magnetic resonance imaging system is defined in the independent claims 8 and 9. The functions of a magnetic resonance imaging system according to the invention are preferably carried out by means of a suitably programmed computer or (micro)processor or by means of a special purpose processor provided with integrated electronic or opto-electronic circuits especially designed for the execution of one or more of the magnetic resonance imaging methods according to the invention.

The invention also relates to a computer program with instructions for executing a magnetic resonance imaging method. It is a further object of the invention to provide a computer program whereby one or more of the magnetic resonance imaging methods according to the invention can be carried out. A computer program according to the invention is defined in the independent claim 10. When such a computer program according to the invention is loaded into the computer of a magnetic resonance imaging system, the magnetic resonance imaging system will be capable of executing one or more magnetic resonance imaging methods according to the invention. For example, a magnetic resonance imaging system according to the invention is a magnetic resonance imaging system whose computer is loaded with a computer program according to the invention. Such a computer program can be stored on a carrier such as a CD-ROM. The computer program is then loaded into the computer by reading the computer program from the carrier, for example by means of a CD-ROM player, and by storing the computer program in the memory of the computer of the magnetic resonance imaging system.

BRIEF DESCRIPTION OF THE DRAWING

These and other aspects of the invention are apparent from and will be elucidated, by way of non-limitative example, with reference to the embodiments described hereinafter and the accompanying drawing; therein The FIGURE shows diagrammatically a magnetic resonance imaging system in which the invention is used.

DESCRIPTION OF THE PREFERRED EMBODIMENTS

The FIGURE shows diagrammatically a magnetic resonance imaging system in which the invention is used. The magnetic resonance imaging system includes a set of main coils 10 whereby the steady, uniform magnetic field is generated. The main coils are constructed, for example so that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary gradients in separate directions, are superposed on the uniform magnetic field. The gradient coils 11, 12 are connected to a controllable power supply unit 21. The gradient coils 11, 12 are energized by application of an electric current by means of the power supply unit 21. The strength, direction and duration of the gradients are controlled by control of the power supply unit. The magnetic resonance imaging system also includes transmission and receiving coils 13, 15 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined, being arranged in the magnetic resonance imaging system, is enclosed by the body coil 13. The body coil 13 acts as a transmission aerial for the transmission of the RF excitation pulses and RF refocusing pulses. Preferably, the body coil 13 involves a spatially uniform intensity distribution of the transmitted RF pulses. The receiving coils 15 are preferably surface coils 15 which are arranged on or near the body of the patient 30 to be examined. Such surface coils 15 have a high sensitivity for the reception of magnetic resonance imaging signals and also a spatially inhomogeneous sensitivity. This means that individual surface coils 15 are mainly sensitive for magnetic resonance signals originating from separate directions, i.e. from separate parts in space of the body of the patient to be examined. The coil sensitivity profile represents the spatial sensitivity of the set of surface coils. The transmission coils, notably surface coils, are connected to a demodulator 24 and the received magnetic resonance signals (MS) are demodulated by means of the demodulator 24. The demodulated magnetic resonance signals (DMS) are applied to a reconstruction unit. The reconstruction unit reconstructs a magnetic resonance image from the demodulated magnetic resonance signals (DMS) and on the basis of the coil sensitivity profile of the set of surface coils. The coil sensitivity profile has been measured in advance and is stored, for example electronically, in a memory unit which is included in the reconstruction unit. The reconstruction unit derives one or more image signals from the demodulated magnetic resonance signals (DMS), which image signals represent one or more, possibly successive three-dimensional density distributions or spectroscopic information. This means that the signal levels of the image signal of such a magnetic resonance image represent the density values or spectroscopic information of the relevant magnetic resonance image. The reconstruction unit 25 in practice is preferably constructed as a digital processing unit 25 which is programmed so as to reconstruct the three-dimensional density distribution or the spectroscopic information from the demodulated magnetic resonance signals and on the basis of the coil sensitivity profile. The digital image processing unit 25 is notably programmed so as to execute the reconstruction in conformity with the so-called SENSE technique or the so-called SMASH technique. The signal on the output of the reconstruction unit is applied to a monitor 26 so that the three-dimensional density distribution or the spectroscopic information can be displayed on the monitor. It is also possible to store the signal from the reconstruction unit in a buffer unit 27 while awaiting further processing.

In order to form a magnetic resonance image or a series of successive magnetic resonance images of the patient to be examined, the body of the patient is exposed to the magnetic field prevailing in the examination space. The steady uniform magnetic field, i.e. the main field, orients a small excess number of the spins in the body of the patient to be examined in the direction of the main field. This generates a (small) net macroscopic magnetization in the body. These spins are, for example nuclear spins such as those of the hydrogen nuclei (protons), but electron spins may also be concerned. The magnetization is locally influenced by application of the gradient fields. The RF excitation pulse excites the spins in the selected part of the object to be examined, meaning that the net magnetization performs a precessional motion about the direction of the main field. Thus, those spins are excited which have a Larmor frequency within the frequency band of the RF excitation pulse in the main field. For example, the spins can thus be excited in a three-dimensional part which extends in substantially three directions in the body. After the RF excitation, the spins slowly return to their initial state and the macroscopic magnetization returns to its (thermal) state of equilibrium. The relaxing spins then emit magnetic resonance signals. Because of the application of the phase encoding gradient fields, the magnetic resonance signals have a plurality of frequency components which encode the spatial positions in, for example a plane. The k space is scanned by the magnetic resonance signals by application of the read-out gradient fields and the phase encoding gradient fields. According to the invention, the application of notably the phase encoding fields results in the sub-sampling of the k space, relative to a predetermined spatial resolution of the magnetic resonance image. For example, a number of lines which is too small for the predetermined resolution of the magnetic resonance image, for example, only half the number of lines, is scanned in the k space.

What is claimed is:

1. A spectroscopic magnetic resonance imaging method comprising the steps of:
    generating an RF excitation pulse in an examination space,
    generating magnetic resonance signals in an object to be examined in the examination space in response to said RF excitation pulse, the magnetic resonance signals being received in a sub-sampled fashion by a set of receiving coils having a coil sensitivity profile,
    wherein a plurality of positions in a measuring plane in the examination space in which the magnetic resonance signals are generated are encoded on the basis of at least two linearly independent components of the wave vector of the magnetic resonance signals,
    wherein a frequency distribution of the magnetic resonance signals represents spectroscopic information concerning the object to be examined, and
    wherein a spectroscopic magnetic resonance image is reconstructed from the sub-sampled magnetic resonance signals and the coil sensitivity profile.

2. The spectroscopic magnetic resonance imaging method as claimed in claim 1, further including applying phase encoding gradients in one of: two and three linearly independent directions, subsequent to the generation of the RF excitation pulse and prior to the reception of the magnetic resonance signals by the receiving coils.

3. The spectroscopic magnetic resonance imaging method as claimed in claim 1, further including
    reconstructing spectroscopic receiving coil images from the sub-sampled magnetic resonance signals received by individual receiving coils, and
    deriving the spectroscopic magnetic resonance image from such spectroscopic receiving coil images and the coil sensitivity profile.

4. A magnetic resonance imaging method comprising the steps of:
    generating an RF excitation pulse in an examination space, and
    generating magnetic resonance signals in an object to be examined in the examination space in response to said RF excitation pulse,
    wherein the magnetic resonance signals are received in a sub-sampled fashion by a set of receiving coils having a spatial coil sensitivity profile,
    wherein the positions in the examination space in which the magnetic resonance signals are generated are encoded in three dimensions on the basis of gradient fields in three linearly independent directions, and
    wherein a three-dimensional density distribution of the object is reconstructed from the sub-sampled magnetic resonance signals and the coil sensitivity profile.

5. The magnetic resonance imaging method as claimed in claim 4, further comprising
    applying phase encoding gradients in two linearly independent directions, subsequent to the generation of the RF excitation pulse and prior to the reception of the magnetic resonance signals by the receiving coils, and
    perpendicularly applying a read-out gradient to the directions of the phase encoding gradients during the reception of the magnetic resonance signals.

6. The magnetic resonance imaging method as claimed in claim 4, wherein
    three-dimensional receiving coil density distributions are reconstructed from the sub-sampled magnetic resonance signals received by individual receiving coils, and
    the three-dimensional density distribution of the object is reconstructed from the receiving coil densities and the coil sensitivity profile.

7. A magnetic resonance imaging method (MRI method), comprising the steps of:
    administering a contrast agent to the patient to be examined,
    generating an RF excitation pulse in an examination space,
    generating magnetic resonance signals in the patient to be examined in response to said RF excitation pulse, and
    receiving magnetic resonance signals generated by the RF excitation pulse in the part of the patient to be examined in which the administered contrast agent is present utilizing a set of at least one receiving coil,
    wherein the positions in the examination space in which the magnetic resonance signals are generated are encoded in three dimensions on the basis of gradient fields in three linearly independent directions, and
    wherein a three-dimensional density distribution of a part of the object filled with contrast agent is reconstructed from the sub-sampled magnetic resonance signals and the coil sensitivity profile.

8. A magnetic resonance imaging system, comprising:
    first generating means arranged to generate an RF excitation pulse in an examination space, and
    second generating means arranged to generate, due to the RF excitation pulse, magnetic resonance signals in an object to be examined in the examination space,
    wherein the magnetic resonance signals are received in a sub-sampled fashion by a set of receiving coils having a coil sensitivity profile,
    wherein the positions in a measuring plane in the examination space in which the magnetic resonance signals are generated are encoded on the basis of at least two linearly independent components of the wave vector of the magnetic resonance signals, wherein a frequency distribution of the magnetic resonance signals represents spectroscopic information concerning the object to be examined, and wherein a spectroscopic magnetic resonance image is reconstructed from the sub-sampled magnetic resonance signals and the coil sensitivity profile.

9. A magnetic resonance imaging system constructed to include:

first means to generate an RF excitation pulse in an examination space, second means to generate, due to the RF excitation pulse, magnetic resonance signals in an object to be examined in the examination space, and means to receive the magnetic resonance signals in a sub-sampled fashion by way of a set of receiving coils having a spatial coil sensitivity profile, wherein the positions in the examination space in which the magnetic resonance signals are generated are encoded in three dimensions on the basis of gradient fields in three linearly independent directions, and wherein a three-dimensional density distribution of the object is reconstructed from the sub-sampled magnetic resonance signals and the coil sensitivity profile.

10. A computer program with instructions to:

receive a plurality of magnetic resonance signals in a sub-sampled fashion by way of a set of receiving coils having a coil sensitivity profile, encode positions in a measuring plane in the examination space in which the magnetic resonance signals are generated on the basis of at least two linearly independent components of the wave vector of the magnetic resonance signals, representing a frequency distribution of the magnetic resonance signals as spectroscopic information concerning the object to be examined, and reconstructing a spectroscopic magnetic resonance image from the sub-sampled magnetic resonance signals and the coil sensitivity profile.

* * * * *